United States Patent [19]
Gouldsberry et al.

[11] Patent Number: 4,853,628
[45] Date of Patent: Aug. 1, 1989

[54] APPARATUS FOR MEASURING CIRCUIT PARAMETERS OF A PACKAGED SEMICONDUCTOR DEVICE

[75] Inventors: Gary R. Gouldsberry, Cupertino; Mark E. Fitzpatrick, San Jose, both of Calif.

[73] Assignee: Gazelle Microcircuits, Inc., Santa Clara, Calif.

[21] Appl. No.: 95,284

[22] Filed: Sep. 10, 1987

[51] Int. Cl.$^4$ ............................................. G01R 15/12
[52] U.S. Cl. ............................. 324/158 R; 324/73 AT
[58] Field of Search .......... 324/158 R, 158 D, 158 F, 324/158 T, 73 R, 73 AT, 73 PC, 79 R; 250/398

[56] References Cited

U.S. PATENT DOCUMENTS

| | | | |
|---|---|---|---|
| 3,961,251 | 6/1976 | Hurley | 324/73 AT |
| 3,961,252 | 6/1976 | Eichelberger | 324/73 AT |
| 3,961,254 | 6/1976 | Cavaliere | 324/73 AT |
| 3,969,670 | 7/1976 | Wu | 324/73 AT |
| 4,495,628 | 1/1985 | Zasio | 324/73 AT |

FOREIGN PATENT DOCUMENTS

| | | |
|---|---|---|
| 053665 | 10/1981 | European Pat. Off. . |
| 084260 | 1/1984 | European Pat. Off. . |
| 144680 | 10/1984 | European Pat. Off. . |
| 141681 | 11/1984 | European Pat. Off. . |

Primary Examiner—Michael J. Tokar
Attorney, Agent, or Firm—Skjerven, Morrill, MacPherson, Franklin & Friel

[57] ABSTRACT

A semiconductor device includes as part of the integrated circuit thereof a test structure which allows testing of the semiconductor device through the device pins, to allow adjustment of various parameters of the circuit if desired for obtainment of optimum performance, and with the circuit being operable under normal conditions without degradation in relation to its optimum design situation.

4 Claims, 2 Drawing Sheets

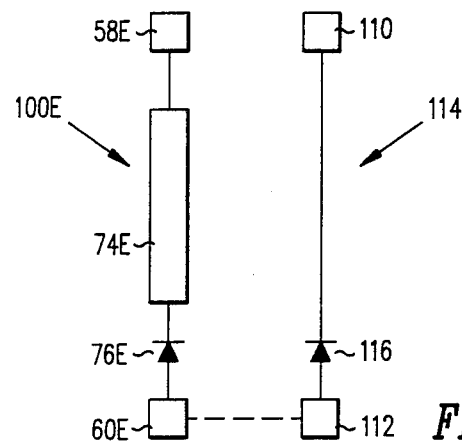
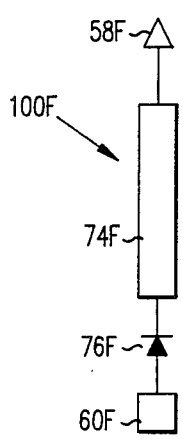
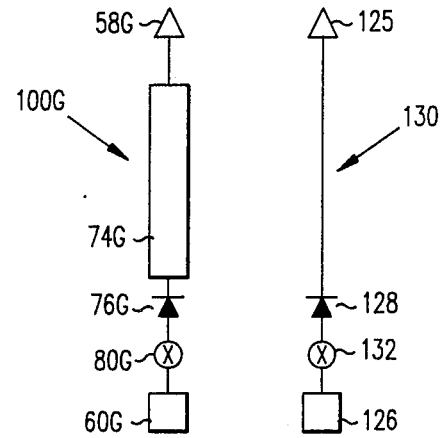

APPARATUS FOR MEASURING CIRCUIT PARAMETERS OF A PACKAGED SEMICONDUCTOR DEVICE

BACKGROUND OF THE INVENTION

1. Field of the Invention

This invention relates to semiconductor device testing means, and more particularly, to a test structure which is part of an integrated circuit chip, allowing testing of a semiconductor device through the device pins thereof.

2. Description of the Prior Art

It will be readily recognized that testing of a semiconductor device through the device pins thereof is highly advantageous. This would allow appropriate testing of the device in its packaged environment so that meaningful test information can be achieved. It would be also advantageous that this be achieved through the use of an on-chip test structure which further allows that once testing is undertaken, various parameters of the circuit can be adjusted for attainment of optimum performance, with the circuit portion having been adjusted (if needed) operating under normal conditions without degradation in relation to its optimum design situation.

Heretofore, the previous goals have not been achieved. While, various devices include on-chip circuit elements connected with the pins thereof (see FIG. 1 showing an input continuity diode, FIG. 2 showing an LS TTL input structure, and FIG. 3 showing a TTL input structure, all labeled as prior art), there is no disclosure of a test structure connected to a circuit portion as part of a semiconductor device for allowing testing of the circuit portion through pins of the device.

SUMMARY OF THE INVENTION

It is accordingly an object of this invention to provide means for allowing testing of a semiconductor circuit device through device pins thereof, to provide relevant circuit information.

Broadly stated, the invention is in a semiconductor device having a circuit portion and a plurality of pins, and comprises a test structure as part of the device and connected to at least one of the pins of the device, the test structure in use providing electrical information concerning the circuit portion.

BRIEF DESCRIPTION OF THE DRAWINGS

Other objects of the invention will become apparent from a study of the following specification and drawings, in which:

FIGS. 5-11 show various alternate embodiments of the invention.

DESCRIPTION OF THE PREFERRED EMBODIMENTS

Figure 1:
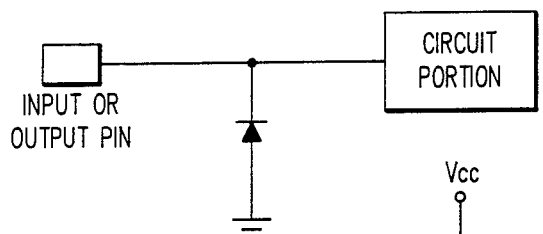
FIGS. 1-3 are schematic views of various prior art circuits.
Figure 2:
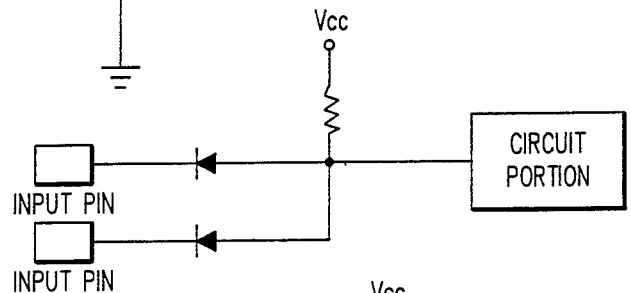
Figure 3:
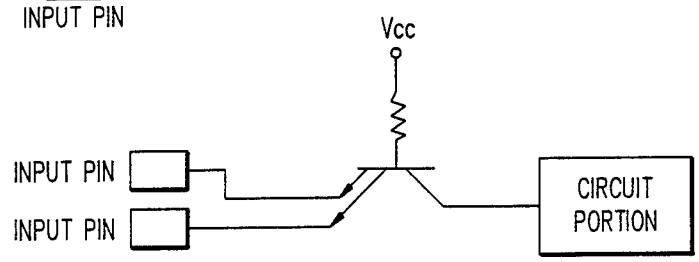
Figure 4:
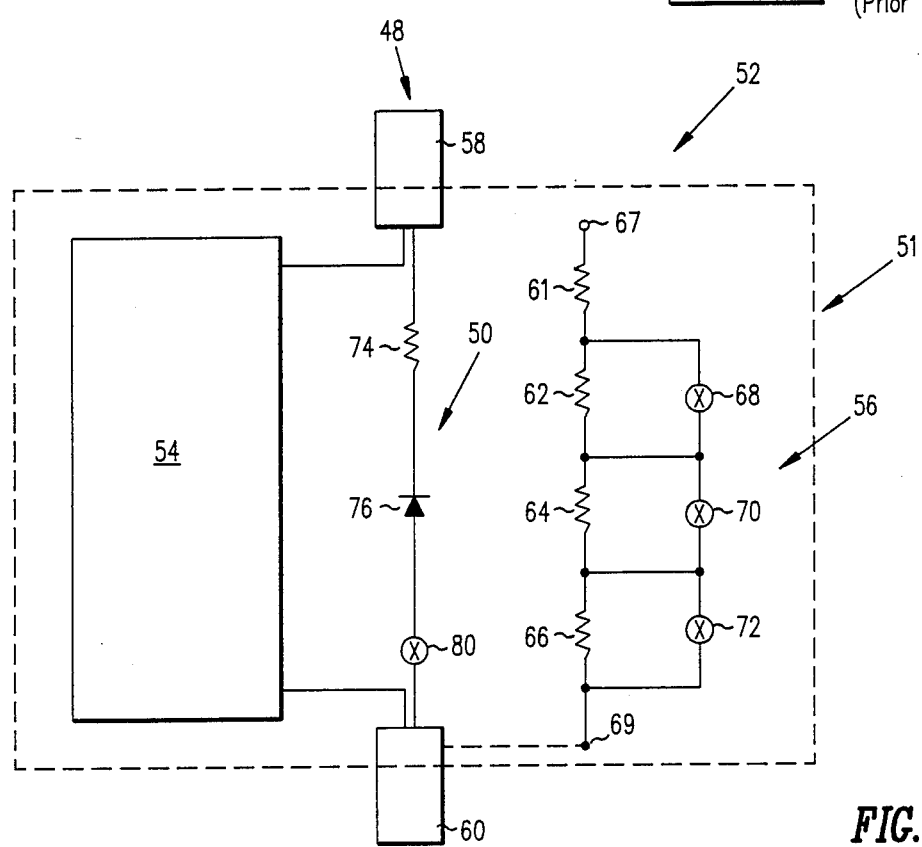
FIG. 4 is a schematic view of a first embodiment of the invention.

Referring to FIG. 4, a first embodiment of the invention 50 is shown therein. The invention is part of a semiconductor device 48, in fact being an on-chip test structure 50 which is part of an integrated circuit 52 which may further include a circuit portion 54 connected to the test structure 50 and a circuit portion 56 not connected to the test structure 50. The test structure 50 is connected to a pair of device pins 58, 60, as is the circuit portion 54, which may take the form of any one of a number of circuit portions of an integrated circuit. On the other hand, the circuit portion 56 is shown as not connected to the test structure in any manner, yet of course it is part of the same integrated circuit 52 containing the circuit portion 54 and test structure 50.

The circuit portion 56 includes resistors 61, 62, 64, 66, connecting nodes 67 and 69. In parallel with each resistor 62, 64, 66 is a respective disconnectable link 68, 70, 72, in the form of a laser programmable fuse.

The test structure 50 takes the form of a resistor 74 connected to the pin 58, a diode 76 connected to the resistor 74, and a disconnectable link 80 in the form of a laser programmable fuse connected to pin 60 and diode 76. Pin 58 is normally the voltage supply terminal at which higher potential is supplied to the circuit 52, while the pin 60 is normally a signal receiving pin. The diode 76 is reverse biased in the direction from the pin 58 which is at higher potential in normal operation of the device 48 toward the pin 60 which is at lower potential in the normal operation of the device 48.

In the use of the test structure 50, the device 48 is in the packaged state (the package being indicated at 51) but with the lid thereof off, while the pins 58, 60 are disconnected from any power or signal source. For testing purposes, a voltage or current is applied to the pin 60, while the pin 58 is held at ground. Current flows from the pin 60 to the pin 58 through the fuse 80, diode 76, and resistor 74, the diode 76 now being forward biased in the direction from the pin 60 at higher potential during test toward the pin 58 at lower potential during test. If voltage applied to pin 60 is known, current can be measured through the test structure, or the converse, if current applied to the terminal 60 is known, voltage across the test structure can be measured, so that the value of the resistance of the resistor 74 can be known by the equation $$R_{74} = \frac{V \text{ (test voltage)} - \phi}{I}$$

where $\phi$ equals the voltage drop of the diode 76. Assuming, for example, that it is now known that resistor 74 has an actual value of 4K ohms, when it was designed to have a nominal, target value of 5K ohms, this knowledge of proportion can be applied to the resistors of the resistor chain 61, 62, 64, 66 in series so that overall resistance of that chain can be chosen as appropriate. That is, in the example given, since the resistance of the resistor 74 is 20% lower than the nominal or target value, it can be inferred that the resistance of the resistor 61, and each of the resistors 62, 64, 66, is 20% lower than each individual nominal, target value thereof. In order to increase the resistance as seen between nodes 67 and 69 to the target value of 5K ohms, fuses 68, 70, and/or 72 can be blown as chosen to bring resistors 62, 64, 66 (as chosen) into series with the resistor 61. Since the value of each of these resistors 62, 64, 66 is known as a characteristic of the semiconductor fabrication process the target resistance overall between nodes 67, 69 can be achieved. It is to be noted that in furtherance of this goal, whether resistor 74 is measured high or low of the target value, the value of resistor 61 is chosen so that at least one of the fuses 68, 70, 72 must be blown in order to move toward the target value.

Subsequent to the testing as described above and the blowing by laser of any one or more of the fuses 68, 70, 72, the disconnectable link in the form of fuse 80 is blown by means of a laser so that the circuit portion 54 connected to the pins 58, 60 can now operate as part of an overall circuit 52 without degradation of the operation of the circuit portion 54 or the overall circuit 52. This is likewise the case with the circuit portion 56, which of course is not connected to the test structure 50 in any manner.

It will also be seen that the above feature of no degradation of operation of the circuit 52 would be achieved even if the circuit portion 56 was connected to one or more of the pins 58, 60 (see dotted line connecting pin 60 and node 68) since the blowing of the fuse 80 would disconnect the test structure 50 from the circuit portion 56, in addition to disconnecting the test structure 50 from the circuit portion 54 as previously described, so that the test structure 50 plays no part in the normal operation of the device 48.

It will thus readily be seen that the test structure 50 is capable of providing test information in relation to circuit portions which are not connected thereto, such as circuit portion 56, and with relation to circuit portions which are connected thereto, for example, circuit portion 54. In either case, whether through the fact that the circuit portion was initially not connected to the test structure, or through subsequent disconnection of the circuit portion from the test structure due to the blowing of the fuse 80, the circuit portions operate without degradation in operation of the device 48, as compared to a device 48 not including the test structure 50.

If desired, the test structure 100A, shown in block diagram form (FIG. 5) (which block 74A may include, for example, a resistor and/or a load device transistor), excludes a diode as previously described, and further excludes the disconnectable link. This embodiment shows the pin 58A as not being one designed to receive supply voltage during normal operation of the circuit 48. In this situation, the test structure 100A is not disconnectable from the overall circuit device 48, but still allows appropriate information gathering similar to the manner described above.

FIG. 6 shows a variation of the structure of FIG. 5 in that the pin 58B is in fact the voltage supply pin of the device 48 in its normal operation. FIG. 7 shows a variation of the structure shown in FIG. 6, including the diode 76C previously described in the main embodiment. FIG. 8 shows the test structure 100D of the main embodiment, including the laser programmable fuse 80D and diode 76D as described therein.

Referring to FIG. 9, this drawing shows a test device 100E similar to that previously shown in FIG. 5 but further including a diode 76E as previously described in the preferred embodiment. Additionally included is a second test structure 114. This test structure 114 is connected between a pair of pins 110, 112, one of which may be common with one of pins 58E, 60E, but with at least one of the pair of pins 58E, 60E being different from one of the pins 110, 112. Inclusion of a test structure 114 including only the diode 116 (both such diodes 76E, 116 being forward biased in the direction from higher potential to lower potential during testing) allows one to use both test structures independently to realize and compensate for the value of the diodes 76E, 116 (these having been fabricated to be substantially identical through appropriate processing steps).

The principle is the same in the structure of FIG. 10, which includes a test structure 100F similar to that shown in FIG. 10 between two pins 58F, 60F, and a test structure 118 including only a diode 120 between two pins 122, 124.

Similarly, FIG. 11 shows a test structure 100G similar to that shown in FIG. 8 connecting two pins 58G, 60G and another test structure 130 connecting two pins 125, 126, the test structure 130 including a diode 128 and a disconnectable link 132 in the form of a laser programmable fuse 132 connecting the diode 128 and pin 126. In the case of FIGS. 11 and 12, pins 58F, 122, 58G, 125 are shown as voltage supply pins for the device in normal operation, while in FIG. 9, the pin 110 is shown as a signal pin.

Thus, in the cases of FIGS. 9, 10 and 11, the impact on testing by inclusion of a diode in each of the test structures 100E, 100F, 100G can be compensated for.

We claim:

1. In a semiconductor device having a circuited portion and a plurality of pins, a test structure as part of said device and connected to a part of pins of the device, the test structure in use providing electrical information concerning the circuit portion, and further comprising means comprising a disconnectable link as part of said test structure for providing that the circuit portion operates without degradation in operation of the device, as compared to a device not including said test structure, wherein the test structure in use thereof is connected to the circuit portion, wherein the test structure further comprises a diode forward biased in the direction from the pin at higher potential during testing toward the pin at lower potential during testing, wherein the disconnectable link comprises a laser programmable fuse connected between the pair of pins.

2. The semiconductor device of claim 1 wherein one of the pins is the voltage supply pin in the operation of the device.

3. In a semiconductor device including a circuit portion and a plurality of pins, a first test structure connected to a pair of pins, a second test structure connected to a pair of pins, each test structure in use providing electrical information concerning the circuit portion, at least one of the first pair of pins being different from one of the second pair of pins, the first test structure including load means between the first pair of pins, and a diode forward biased in the direction from the pin of the first pair of pins at higher potential during testing toward the pin of the first pair of pins at lower potential during testing, and a second test structure including a diode forward biased in the direction from the pin of the second pair of pins at higher potential during testing toward the pin of the second pair of pins at lower potential during testing, wherein the first test structure includes as a part thereof a disconnectable link connecting the first pair of pins, and wherein the second test structure includes as a part thereof a disconnectable link connecting the second pair of pins, whereby the disconnectable links are laser programmable fuses.

4. In a semiconductor device having a circuit portion and a plurality of pins, a test structure as part of said device and connected to at least one pin of the device, the tested structure in use providing electrical information concerning the circuit portion, and further comprising means for providing that the circuit portion operates without degradation in operation of the device, as compared to a device not including said test structure, said means for providing that the circuit portion operates without degradation comprising a laser programmable fuse.

* * * * *

UNITED STATES PATENT AND TRADEMARK OFFICE
CERTIFICATE OF CORRECTION

PATENT NO. : 4,853,628
DATED : August 1, 1989
INVENTOR(S) : Gary R. Gouldsberry et al.

It is certified that error appears in the above-identified patent and that said Letters Patent is hereby corrected as shown below:

Col. 4, line 17, change "circuited" to --circuit--.

Col. 4, line 19, change "part" to --pair--.

Col. 4, line 55, change "whereby" to --wherein--.

Col. 4, line 60, change "tested" to --test--.

Signed and Sealed this

Ninth Day of October, 1990

Attest:

HARRY F. MANBECK, JR.

Attesting Officer    Commissioner of Patents and Trademarks